US006380616B1

(12) United States Patent
Tutsch et al.

(10) Patent No.: US 6,380,616 B1
(45) Date of Patent: Apr. 30, 2002

(54) SEMICONDUCTOR COMPONENT WITH A NUMBER OF SUBSTRATE LAYERS AND AT LEAST ONE SEMICONDUCTOR CHIP, AND METHOD OF PRODUCING THE SEMICONDUCTOR COMPONENT

(75) Inventors: Günter Tutsch, Saal; Achim Neu, Regensburg, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/617,652

(22) Filed: Jul. 17, 2000

Related U.S. Application Data (63) Continuation of application No. PCT/DE99/00069, filed on Jan. 14, 1999.

(30) Foreign Application Priority Data

Jan. 15, 1998 (DE) .......................... 198 01 312

(51) Int. Cl.⁷ .......................... H01L 23/02; H01L 23/48
(52) U.S. Cl. ...................... 257/686; 257/685; 257/777; 257/783; 257/693
(58) Field of Search ................................ 257/686, 685, 257/777, 778, 737, 783, 678, 693; 438/109, 108, 118

(56) References Cited

U.S. PATENT DOCUMENTS

| | | | |
|---|---|---|---|
| 4,868,712 A | | 9/1989 | Woodman |
| 4,894,706 A | | 1/1990 | Sato et al. |
| 5,434,745 A | | 7/1995 | Shokrgozar et al. |
| 5,611,876 A | | 3/1997 | Newton et al. |
| 5,708,297 A | | 1/1998 | Clayton |
| 5,726,492 A | * | 3/1998 | Suzuki et al. ............... 257/685 |
| 5,786,628 A | * | 7/1998 | Beilstein et al. ............ 257/684 |
| 5,923,080 A | | 7/1999 | Chun |

FOREIGN PATENT DOCUMENTS

| | | |
|---|---|---|
| DE | 3838085 A1 | 5/1990 |
| DE | 19720275 A1 | 11/1997 |
| EP | 0575806 A2 | 12/1993 |
| EP | 0706220 A1 | 4/1996 |
| JP | 58-219757 | 12/1983 |
| JP | 59-138355 | 8/1984 |
| JP | 61-101067 | 5/1986 |
| JP | 62-119952 | 6/1987 |
| JP | 851181 | 2/1996 |

OTHER PUBLICATIONS

Published International Application No. 95/05005 (Contolatis et al.), dated Feb. 16, 1995.
"Kompakte Leiterplatten durch Plasma–Bohren", Wakter Schmidt, Carl Hanser Verlag, München, F & M 104, 1996, pp. 844–848.
"A New Approach to Using Anisotropically Conductive Adhesives for Flip–Chip Assembly", Alan M. Lyons et al., IEEE Transactions on Components, Packaging and Manufacturing Technology, Part A, vol. 19, No. 1, Mar. 1990, pp. 5–11.
"Mechanism of Electrical Conduction Through Anisotropically Conductive Adhesive Films", Masuo Mizuno et al., IEEE Transactions on Components, Packaging and Manufacturing Technology, Part A, vol. 19, No. 4, Dec. 1996, pp. 546–553.

* cited by examiner

*Primary Examiner*—Jhihan B Clark
(74) *Attorney, Agent, or Firm*—Herbert L. Lerner; Laurence A. Greenberg; Werner H. Stemer

(57) ABSTRACT

A semiconductor component has one or more semiconductor chips with contact pads, a number of substrate layers, component contacts and conductor tracks which establish the electrical connection between the contact pads of the semiconductor chip and the component contacts. The substrate layers are respectively provided with conductor tracks and at least one opening and the chip or chips are placed in the opening. A plurality of substrate layers are interconnected lying above one another. The conductor tracks of respective substrate layers end in an area in the vicinity of the at least one semiconductor chip and in an edge area of the respective substrate layer.

24 Claims, 7 Drawing Sheets

SEMICONDUCTOR COMPONENT WITH A NUMBER OF SUBSTRATE LAYERS AND AT LEAST ONE SEMICONDUCTOR CHIP, AND METHOD OF PRODUCING THE SEMICONDUCTOR COMPONENT

CROSS-REFERENCE TO RELATED APPLICATION

This is a continuation of copending international application PCT/DE99/00069, filed Jan. 14, 1999, which designated the United States.

BACKGROUND OF THE INVENTION

Field of the Invention

The invention lies in the semiconductor technology field. More specifically, the invention relates to a semiconductor component which comprises at least one semiconductor chip having contact pads, a number of substrate layers, component contacts and conductor tracks which establish the electrical connection between the contact pads of the at least one semiconductor chip and the component contacts. The invention further relates to a method of producing such a semiconductor component.

Surface-mounted electronic components, also called SMD components, are usually embedded in a package of plastic molding compound from which electrical connections are brought out. There exist a large number of different types of package constructions which are of different sizes and have a different number of connections. In that configuration, a semiconductor chip is first connected to a lead frame. The semiconductor chip is usually connected to the lead frame by means of bonding, by soldering or by alloying. After the semiconductor chip has been attached, its individual connecting points are connected to the connections of the support frame, for example by means of bonding wires. After that, the semiconductor chip and the connections of the lead frame are injection-molded in such a manner that the semiconductor chip is completely encapsulated and the connections protrude from the package.

Semiconductor components must be increasingly thinner and they must be constructed with a smaller base area and less volume consumption. In the case of a storage component, the highest possible storage density is to be implemented in the smallest possible volume. There is already an ultra-thin package for storage chips, the so-called bottom-leaded plastic package (BLP). If the package space requirement is to be reduced, this can only be done by means of a much finer lead pitch in the case of a peripheral arrangement of the external leads. However, this miniaturization of the arrangement of the external leads brings one ever closer to the boundaries of processing capability, both in the production of the design and in the soldering-in on the chassis. This necessitates completely new technologies of the design, for example the multi-chip module.

In a multi-chip module, a number of semiconductor chips are placed in one plane next to one another on a substrate and are connected to the latter. In that configuration, it is possible to implement internal chip-to-chip connections. Apart from the plastic lead-frame packages, there are also ceramic packages comprising a cavity in which the semiconductor chips are inserted. There are different principles of design:

In a first form, a multi-layer wiring system (substrate) is integrated in a plastic package.

In a second form, the package includes a wiring frame system (cofired ceramic and laminate packages).

In a third, and the simplest, form the package is designed without wiring frame system. This offers the possibility of connecting the semiconductor chips directly to one another via a wire link in simple multi-chip modules having two or, at a maximum, three semiconductors.

The problem in the production of multi-chip modules is that the substrate must be produced very expensively as multi-layer wiring system. In a suitable sequence, insulating and metal layers and via holes must be placed in order to connect the chip connections to one another or, respectively, to conduct them to the outside. The current processes used in mounting the semiconductor chips are chip bonding and electrical contacting of the semiconductor chip onto the substrate, using both the wire bonding process and the flip chip method. Following this, the components are encapsulated by being sheathed with a plastic compound. In the case of ceramic packages, soldered or welded seals with a metal lid are normally used.

Apart from the complicated production of the substrate, the main disadvantage of the multi-chip modules consists in that they are not suitable for economic mass production.

U.S. Pat. No. 5,434,745 describes a semiconductor component which has a high packing density and, at the same time, requires little space by providing a module-by-module structure. There, a module consists of two substrate layers, the first substrate layer having a structured metalization on which a semiconductor chip is placed. The second substrate layer is formed with an opening instead of the semiconductor chip and is connected to the first substrate layer in a superimposed manner. An arbitrary number of modules can be connected to one another stacked on top of one another. The stack includes on two opposite outer sides semicircular via holes which are precisely above one another over all substrate layers, which holes are filled with a conductive material so that all semiconductor chips are electrically connected to one another. The stack is placed on another substrate, packaged and then provided with external component contacts.

SUMMARY OF THE INVENTION

The object of the invention is to provide a semiconductor component with several substrate layers and one or more semiconductor chips, as well as a method of producing the semiconductor component, which overcome the above-noted deficiencies and disadvantages of the prior art devices and methods of this kind, and which semiconductor component has the greatest possible packaging density with the smallest possible base area. Furthermore, the component should be usable for radio-frequency applications.

With the above and other objects in view there is provided, in accordance with the invention, a vertically mountable and stacked semiconductor component, comprising:

a plurality of interconnected substrate layers lying above one another and having ends;

at least one semiconductor chip formed with contact pads disposed in an opening formed in the substrate layers;

external component contacts disposed laterally at the ends of respective substrate layers;

an electrical connection between the contact pads of the semiconductor chip and the component contacts, the electrical connection including conductor tracks of a respective substrate layer extending from an area at the semiconductor chip to the edge area of the respective substrate layer, the conductor tracks of a substrate layer having a substantially equal length; and the electrical connection being configured to define a signal delay of substantially equal length between each contact pad of the semiconductor chip to an associated the component contact.

There is also provided, in accordance with the invention, a method of producing the vertically mounted and stacked semiconductor component. The method comprises the following steps:

providing a first layer of a two-layer substrate material with a plurality of substantially equal-length conductor tracks and a second layer of the two-layer substrate with at least one opening, the conductor tracks ending on one side of the substrate layer for placing external component contacts;

placing at least one semiconductor chip in the at least one opening;

connecting the at least one semiconductor chip to the first substrate layer;

electrically contacting the at least one semiconductor chip with the conductor tracks; and placing a further substrate layer without conductor tracks and openings on the two-layer substrate material and covering the second layer with the opening.

Furthermore, there is provided a method of producing a semiconductor component with plug contacts, which comprises the following steps:

providing a first layer of a two-layer support material with substantially equal-length conductor tracks, and a second layer of the two-layer support material with an opening, the conductor tracks being structured between the two layers, the first layer having an elongated side provided with metalization contacts and mechanical coding;

placing at least one semiconductor chip into the opening;

connecting the at least one semiconductor chip to the first substrate layer;

electrically contacting the at least one semiconductor chip with the conductor tracks; and placing a further substrate layer without conductor tracks and openings on the two-layer substrate material and covering the second layer with the opening.

In other words, a number of semiconductor chips are accommodated in one package and they are arranged not only in one substrate plane but it is also possible to arrange them three-dimensionally. The semiconductor component, therefore, consists of at least one semiconductor chip and is constructed of a number of superimposed substrate layers which are permanently joined to one another. In this arrangement, there are substrate layers which are provided with at least one opening, and substrate layers with conductor tracks. The openings of the substrate layers are used for accommodating in each case at least one semiconductor chip. The conductor tracks of respective substrate layers terminate in an area in the vicinity of the at least one semiconductor chip and in an edge area of the respective substrate layers, that is to say at one side of the semiconductor component. The conductor tracks are connected to component contacts there. The semiconductor chips located in the openings are electrically conductively connected to the conductor tracks so that an electrical connection to the outside can be established via the component contacts of the semiconductor component. The advantage of the semiconductor component built up of a number of substrate layers consists in that each substrate layer can include openings into which semiconductor chips can be inserted so that both a number of semiconductor chips can be arranged next to one another in one substrate layer and above one another. Due to this structure, a compact package dimension is possible. A great advantage of the semiconductor component according to the invention consists in that the conductor tracks are conducted to the outside in the plane of the substrate layers. The conductor tracks can be placed on the substrate layers by simple and inexpensive etching or laminating. The conductor track density remains the same in each substrate layer plane which ensures a simple run of the conductor tracks even in the lower substrate layers. According to the invention, the semiconductor chips of the semiconductor component, after having been mounted on a chassis, are located in a vertical position similar to a so-called "vertical surface mounting package" (VSMP). Furthermore, known production methods can be used in the production of the substrate layers. The openings can be made, for example, by a punching or stamping process. The conductor tracks can be placed on a substrate layer by means of an etching process or a galvanic process. The substrate layers can be attached, for example, by means of bonding, alloying or laminating. A further advantage consists in that various methods can be used for producing electrical contacts. The electrical contacting can take place, for example, via bonding wires, via a so-called spider band or via a so-called flip chip process. Due to the fact that the openings of a substrate layer are covered by the overlying substrate layer, it is not necessary to protect the semiconductor chip located in the opening by means of a plastic molding compound. It is only in the case where a substrate layer located at the edge of the semiconductor component includes an opening that a corresponding plastic molding compound or a cover must be provided for the opening for protecting the semiconductor chip. However, it is also possible at any time to fill each opening with a plastic molding compound.

In accordance with an added feature of the invention, a substrate layer on which conductor tracks are provided is alternately arranged on top of one another with a substrate layer which includes at least one opening. The advantage of this type of arrangement consists in that the semiconductor component can be produced in a particularly easy manner since there is no elaborate disentanglement of the conductor tracks within the substrate layers required. Depending on the number of connections of the semiconductor chip required, it is sufficient to place the conductor tracks on one top of the substrate layer. The substrate layer containing conductor tracks and the substrate layer containing the at least one opening are connected to one another in such a manner that the conductor tracks come to lie between the two substrate layers. The semiconductor chip can be inserted into this two-layer support element and attached. After the electrical contacting of the semiconductor chip and possible filling of the opening with a plastic molding compound, a further two-layer support material can be applied. The second two-layer support material is applied to the substrate layer which has the opening. A particularly space- and volume-saving semiconductor component is given if the openings of the superimposed semiconductor layers are arranged above one another.

By alternately arranging a substrate layer with conductor tracks and a substrate layer with opening, it is conceivable that one of the two terminating substrate layers of the semiconductor component includes an opening comprising a semiconductor chip. The protection of the semiconductor chip located in the opening can be ensured by filling it with plastic molding compound. In an advantageous embodiment, a further substrate layer, which includes neither conductor tracks nor openings, is placed onto the substrate layer with opening. This further substrate layer serves exclusively as cover layer and closes off the semiconductor component.

The conductor tracks on a substrate layer are placed in such a manner that after the connection to a substrate layer with opening, the one ends of the conductor tracks are located within an opening. After all substrate layers of the component have been joined together, the other ends of the conductor tracks point to one side of this semiconductor component. The component contacts are connected to these conductor track ends of the semiconductor component. The component contacts are used for the further electrical contacting on an assembly.

After all substrate layers have been connected and a substrate layer serving as cover layer has been put in place, the semiconductor component includes a cube-shaped form of construction. This is the solution which saves the most space. In a further embodiment, at least one substrate layer can extend over other substrate layers on one or more sides on which no component contacts are placed. Enlarging the area of individual substrate layers enlarges the surface of the semiconductor component. This facilitates the removal of heat. The individual elongated substrate layers handle the function of a heat distributor in this case. It is conceivable to enlarge arbitrary substrate layers. In an especially advantageous embodiment, a substrate layer with optimized area and a substrate layer with enlarged area are alternately arranged.

This arrangement makes it possible to achieve the largest surface of the semiconductor component. In an advantageous embodiment, substrate layers comprising conductor tracks are utilized as heat distributors. It is possible to optimize the heat distribution or, respectively, heat removal depending on how far these substrate layers used as heat distributors extend over the substrate layers with optimized area.

In a further variation, the substrate layer which is provided with conductor tracks and includes at least one semiconductor chip can be provided with conductor tracks on one or two sides. The advantage of a substrate layer having conductor tracks on both sides consists in that in the case of semiconductor chips having a large number of connections or of a number of semiconductor chips having a large number of connections in aggregate, the lead pitch can be selected in a size which can be easily processed.

Providing a number of semiconductor chips in one semiconductor component necessitates a supply to each semiconductor chip. In a conventional embodiment, each semiconductor chip is supplied via its own supply line. In an especially advantageous embodiment, all semiconductor chips are supplied via a common supply line. The advantage of this feature consists in that the number of connections of the semiconductor component can be reduced by (number of semiconductor chips −1)×2. For this purpose, two supply conductor tracks are run into the semiconductor component on one substrate layer, a "conductor track" being generated perpendicularly to the areas of the semiconductor chips by means of via holes in the individual substrate layers. The via holes, in turn, are connected in the respective substrate layers to conductor tracks which are connected to the supply connections of the semiconductor chip.

The individual substrate layers can be joined to one another by laminating, alloying or bonding. In an especially advantageous embodiment, an anisotropic conductive adhesive is used for the bonding. An anisotropic conductive adhesive has the property of being electrically conductive in one direction but acting as an insulator transversely to this direction. The advantage of using the anisotropic conductive adhesive consists in that when two substrate layers are joined, the via holes of these two substrate layers which are arranged above one another are electrically conductively connected to one another.

The semiconductor chip can be mounted on a substrate layer by bonding, laminating or alloying. Depending on the electrical contacting provided, the contact pads of the semiconductor chip are arranged face up or face down. Depending on the electrical contacting, the contact pads can be arranged on the semiconductor chip surface in any manner. In the case of flip chip contacting, the contact pads can form an array, in the case of spider contacting or of a wire-bond process, the contact pads can be arranged on the peripheral edges of the semiconductor chip. In an especially advantageous embodiment, the contact pads are arranged in one row parallel to one side edge of the semiconductor chip. This can be done either closely to an edge or also in the center. After the semiconductor chip has been mounted on the substrate layer, the contact pads forming one row are arranged in such a manner that they are parallel to the side at which the contact elements of the semiconductor component are placed. If the contact pads are arranged close to one chip edge, this chip edge should be oriented toward the side of the semiconductor component at which the component contacts of the semiconductor component are later placed. In an especially advantageous embodiment, the at least one semiconductor chip is bonded to the respective substrate layer by means of an anisotropic conductive adhesive.

If the semiconductor chips are contacted on the respective substrate layer by means of flip chip contacting, the contact pads of the semiconductor chip are arranged preferably in one row parallel to one side edge of the semiconductor chip. Aligning the contact pads in one row necessitates conductor tracks of equal length on the substrate layer. This provides the advantage that in applications with very high frequency, the same signal delays are generated for each contact pad. In the semiconductor component, all semiconductor chips are preferably arranged precisely above one another so that the same signal delay to the component contacts exists from each contact pad of each semiconductor chip of the semiconductor component due to the equal lengths of the conductor tracks in the respective substrate layers. This is a necessary criterion especially in applications with very high frequencies.

If the semiconductor chips are electrically connected to the conductor tracks of the respective substrate layer by means of bonding wires or by means of a spider tape, conductor track length and electrical connection to semiconductor chip are matched to one another in such a manner that the same signal delay to the component contacts of the semiconductor component from the contact pads of the semiconductor chip is produced.

The semiconductor component according to the invention is characterized by the fact that either FR4 or an aluminum foil, which is at least partially oxidized through, is used as substrate layer material. The advantage of using FR4 consists in that this material is known and can be easily processed, and the existing equipment can be utilized for processing. The advantage of using an aluminum foil which is at least partially oxidized through consists in that the individual substrate layers are more easily bonded than the FR4 foil consisting of polyimide. A further advantage of an aluminum foil consists in that it has a lower price than a polyimide foil, that it cannot absorb any moisture and that better machinability in punching out via holes or openings is ensured compared with FR4. Furthermore, the coefficient of expansion of the aluminum foil is a better match for that of the semiconductor chip. It is also advantageous that the aluminum foil acts as an electrical insulator. If the foil is only partially oxidized through, a core of aluminum remains within the foil. This core serves as electrical shielding of the individual substrate layers against one another. This eliminates any interaction between the electrical characteristics of the semiconductor chips.

The semiconductor component according to the invention is also wherein balls, pins or plug connections can be placed as component contacts.

If balls are provided as component contacts, a ball grid array (BGA) is produced on one side of the semiconductor component. This can be processed by means of the known production steps. Placing the balls on one side of the semiconductor component can be done in various ways. In one embodiment, the conductor tracks of the respective substrate layers are bent around one edge of the respective substrate layer and are flat on the side on which the component contacts are provided. The balls can be placed and mounted on these bent-over conductor tracks. In an advantageous embodiment, the substrate layers which have the openings for accommodating at least one semiconductor chip have recesses on the side on which the component contacts are provided. These recesses include the width of one conductor track and are arranged in such a manner that the conductor tracks of the underlying substrate layer come to lie within the recess. The balls can be inserted into the recesses and soldered to the conductor track. The advantage of this embodiment consists in that the balls are permanently fixed to the conductor tracks and are better secured mechanically against loading. In another advantageous embodiment, support conductor tracks which are opposite the signal-conducting conductor track in the recess and are only used for the purpose of achieving better and more secure soldering and attachment of the ball in the recess are also provided in the recesses. The support conductor track is placed on the underside of the substrate layers on which the signal-conducting conductor tracks are placed. In the preferred embodiment, the recesses are arranged in the substrate layers which have the openings for the semiconductor chips. However, it is also conceivable that the recesses are placed in the substrate layers on which the signal-conducting conductor tracks are located. Using the balls as component contacts is especially appropriate when the semiconductor component is used as storage chip with a volatile memory (DRAM).

Due to the high storage density which the semiconductor component has due to the multiplicity of semiconductor chips, the use of non-volatile memories (ferro DRAMs) is also appropriate. This then provides for a transportable storage medium. For this purpose, the component contacts can be constructed as plug connections or as pins. This provides for a particularly variable use of the semiconductor component. Constructing the component contacts as plug connections is achieved by at least one substrate layer being elongated with respect to the substrate layers with optimized area, on the side on which the component contacts are provided. Advantageously, substrate layers are elongated which are provided with conductor tracks. At the ends of the elongated substrate layers, so-called metalization contacts which provide for the electrical connection to the chassis are applied to the conductor tracks. The metalization contacts can be placed on one or both sides on the ends of the substrate layers. In one embodiment, it is possible to connect the two metalization contacts of a substrate layer to one another and thus to ensure a better contact point to the chassis. If, however, conductor tracks are placed on both sides of the elongated substrate layers, it is conceivable that two different signals are conducted into the chassis on the respective opposite sides. Due to this design, the number of connection contacts can be doubled.

To avoid confusion when plugging the plug connection into the chassis, at least one plug connection of at least one substrate layer includes mechanical coding. The mechanical coding consists, for example, in that the substrate layers which have the plug connections are constructed to be oblique on one side or have a polygonal cutout. It is also conceivable that a recess is provided between two or more metalization contacts. Any form whatever which ensures that the semiconductor component with the plug connections cannot be placed on the chassis in an incorrect manner is conceivable.

Furthermore, as noted above, the method for producing a semiconductor component is part of the invention. The method consists of the following steps for producing a semiconductor component in its simplest form: a two-layer support material is provided, a substrate layer being provided with conductor tracks and the other substrate layer being provided with at least one opening. These two substrate layers are joined in such a manner that the conductor tracks are located between the two substrate layers connected to one another. In each case, at least one semiconductor chip is inserted into the at least one opening and is permanently connected to the substrate layer which has the conductor tracks. The semiconductor chip is then electrically contacted with the conductor tracks. In the simplest form, a further substrate layer which has neither conductor tracks nor openings is placed on these two substrate layers. In the advantageous embodiment, a number of the two-layer support materials are placed above one another, each substrate layer having an opening in which in each case one semiconductor chip is placed. The openings or, respectively, the semiconductor chips, are located precisely on top of one another within the semiconductor component. The advantage of this design is the possibility of designing the signal delays between the contact pads and the respective component contacts to be of equal length.

If the component contacts consist of balls, recesses are additionally provided on the one side of the substrate layer in the substrate layer of the two-layer support material which has the opening. Furthermore, support conductor tracks are placed on the other substrate layer of the two-layer support material which has the conductor tracks, on the opposite side of the substrate layer. The two substrate layers are then processed to become the two-layer support material. In the subsequent step, the chip is again inserted in the opening and electrically connected to the conductor tracks. In the semiconductor component which now has recesses on the side on which the component contacts are provided in this embodiment, the balls are inserted into the recesses and connected to the conductor track and support conductor track. This type of mounting of the balls in the recesses brings with it higher mechanical strength.

In a second embodiment of the semiconductor component with balls as component contacts, the substrate layer which has the conductor tracks is provided with conductor tracks which protrude past one side of the substrate layer in the production of the two-layer support material. The conductor tracks protrude over the thickness of two adjacently located substrate layers as a maximum. After the semiconductor chips have been inserted into the openings and electrically contacted, a number of the two-layer support materials are arranged above one another and permanently connected to one another. After that, a substrate layer used as cover layer is placed. On one side of the semiconductor component, the conductor tracks are now projecting over the side of the semiconductor component. These projecting conductor tracks are bent over on the side of the semiconductor component in a bending process. The balls are placed on the bent-over ends of the conductor tracks which are in contact with the side of the semiconductor component and are connected to the conductor tracks.

If plug connections are provided as component contacts, the substrate layer which has the conductor tracks is elongated on the side on which the component contacts are provided, compared with the substrate layer having the openings. On the ends of the elongated side, metalization contacts are placed on the ends of the conductor tracks on one or both sides. After the semiconductor chip has been inserted into the opening and connected to the two-layer support material, the semiconductor chip is electrically contacted with the conductor tracks. In a subsequent step, a number of these two-layer support materials can be arranged above one another and, finally, a substrate layer without conductor track and without opening is placed on the substrate layer which has the at least one opening.

Other features which are considered as characteristic for the invention are set forth in the appended claims.

Although the invention is illustrated and described herein as embodied in a semiconductor component with a number of substrate layers and at least one semiconductor chip, and a method for producing such a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection wit he accompanying drawings.

DESCRIPTION OF THE PREFERRED EMBODIMENTS

Figure 1:
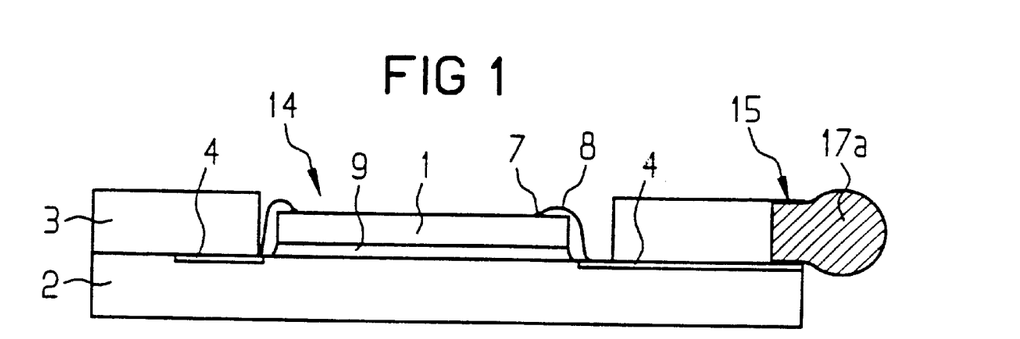
FIG. 1 is a diagrammatic sectional side view of a two-layer support material with a semiconductor chip.

Referring now to the figures of the drawing in detail and first, particularly, to FIG. 1 thereof, there is seen, in vertical section, a two-layer support material which includes two substrate layers 2, 3, a semiconductor chip 1 and a component contact 17. Conductor tracks 4 are placed on the substrate layer 2, for example by electroplating or etching. The substrate layer 3 includes an opening 14 and a recess 15 which, for example, are punched or stamped. The semiconductor chip 1 is inserted in the opening 14 and permanently connected to the substrate layer 2 by means of an adhesive 9. In the embodiment of FIG. 1, the semiconductor chip 1 is arranged with its contact pads 7 pointing upward. The contact pads 7 are electrically connected to the conductor tracks 4 by means of bonding wires 8. A ball 17a which is in electrical contact with the conductor track 4 is inserted in the recess 15. In an advantageous embodiment of the semiconductor component, the recesses 15 in the substrate layer 3 are placed if the semiconductor component is to be connected to a chassis by means of balls 17a. FIG. 1 shows a basic structure of the two-layer support material with an opening 14 and a semiconductor chip 1 inserted therein, which is permanently connected to the substrate layer 2. In FIG. 1, the electrical contacting has been effected with bonding wires 8. However, it is possible at any time to effect the electrical contacting by means of a spider bond. Similarly, the chip can be placed on the substrate layer 2 by means of a flip chip process and connected at the same time to the conductor tracks 4. In the drawing, the semiconductor chip 1 has contact pads 7 on two opposite edges which are electrically connected to the conductor tracks 4. In an advantageous embodiment, the semiconductor chip 1 has only one row with contact pads 7 which are arranged on the side of the semiconductor chip 1 which points toward the component contacts 17. The advantage consists in that, due to this arrangement, equal signal delays are possible from all contact pads 7 of the semiconductor chip 1 to the respective component contacts. This is of great significance especially in radio-frequency applications.

Figure 2:
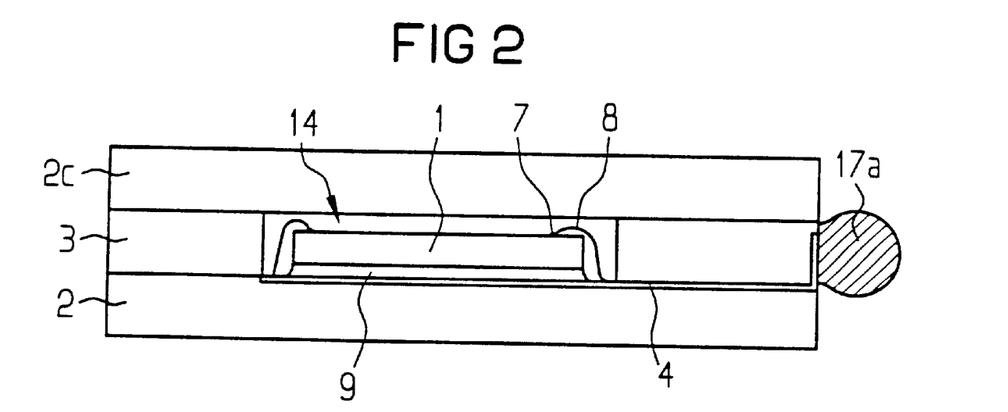
FIG. 2 is a similar view of a simplest embodiment of the semiconductor component consisting of a two-layer support element and a terminating substrate layer.

FIG. 2 shows a semiconductor component according to the invention in its simplest form in cross section. The semiconductor component comprises the two-layer support material 2, 3 and a terminating substrate layer 2c which has neither conductor tracks 4 nor openings 14 or recesses 15. The structure of the two-layer support material is identical with that of FIG. 1. The only difference consists in the electrical contacting of the component contacts 17. In this illustrative embodiment, too, the semiconductor component is connected to a non-illustrated chassis by means of balls 17a. The balls 17a in FIG. 2, however, are not accommodated in a recess 15 but are located on an elongated conductor track 4 which is bent around the edge of the substrate layer 3 and is in close contact with the side edge of the substrate layer 3. The balls 17a are placed on this elongated and bent-over conductor track 4, for example by means of soldering.

Figure 3:
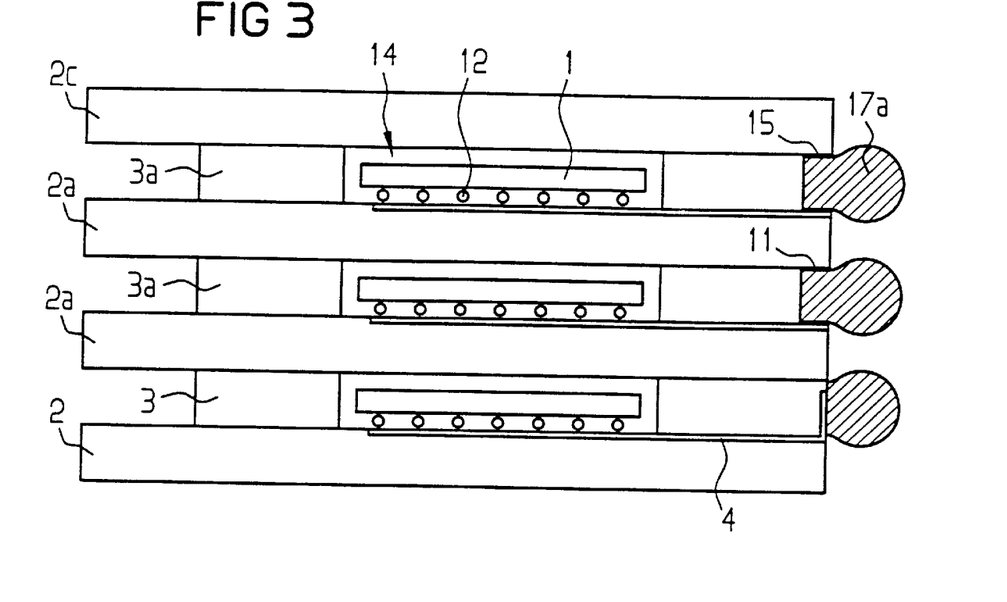
FIG. 3 is a similar view of a semiconductor component according to the invention with a number of substrate layers and a number of semiconductor chips with integrated heat distribution.

FIG. 3 shows a semiconductor component according to the invention in cross section. The semiconductor component consists of a number of substrate layers 2, 3, 2a, 3a, 2c and a number of semiconductor chips 1 and component contacts 17 which are constructed as balls 17a in this case. In the present illustrative embodiment, the semiconductor component is built up of three two-layer support materials and a terminating substrate layer 2c which closes off the semiconductor component toward the top. The substrate layers 2, 2a include on one side conductor tracks 4, all of which are directed toward one side of the semiconductor component. The substrate layers 3, 3a in each case have an opening 14 into which in each case one semiconductor chip 1 is inserted and mechanically connected to the substrate layer 2, 2a by means of flip chip contacting 12 and electrically connected to the conductor tracks 4. The component contacts are constructed as balls 17a. Two of the three two-layer support materials have recesses 15 into which the balls 17a are inserted. To provide better attachment of the balls 17a in the recesses 15, the top of the recess 15, that is the side of the recess 15 opposite to the conductor track 4, is provided with a support conductor track 11. The support conductor track 11 consists of the same material as the conductor tracks 4. These are exclusively used for improving the attachment of the balls 17a in the recess 15. The support conductor tracks 11 have the size of the recesses 15. The component contacts 17 of the bottommost two substrate layers 2, 3 are constructed in accordance with the principle in FIG. 2. The conductor tracks 4 which are placed on the substrate layer 2 are elongated by twice the thickness of one substrate layer past the end of the two-layer support layer at a maximum and are bent around the edge of the substrate layer 3. The bent-over conductor track 4 lies flat against the substrate layer 3 in this area. The balls 17a are permanently connected to the bent-over conductor tracks 4, for example by means of soldering. The semiconductor chips 1 located in the openings 14 are not surrounded by a plastic molding compound in the exemplary embodiment of FIG. 3. However, it is conceivable at any time that the openings 14 are surrounded by plastic molding compound after the semiconductor chip 1 has been inserted and the contact pads 7 have been electrically contacted with the conductor tracks 4. The semiconductor component of FIG. 3 has an especially advantageous embodiment of the substrate layers 2, 3, 2a, 3a, 2c. These substrate layers 2, 2a, 2c are elongated past 3, 3a on the side which is opposite the component contacts 17. The substrate layers 2, 2a, 2c on which the conductor tracks 4 are placed in this case take over a heat distributor function. In the present example, every second substrate layer is elongated past the optimized base area of the substrate layers 3, 3a. However, it is conceivable to carry out the elongation in any substrate layers 2, 3, 2a, 3a, 2c. It is also conceivable that the elongation is carried out not only on the side opposite the component contacts 17 but on all sides of the semiconductor component which do not include any component contacts 17.

Figure 4:
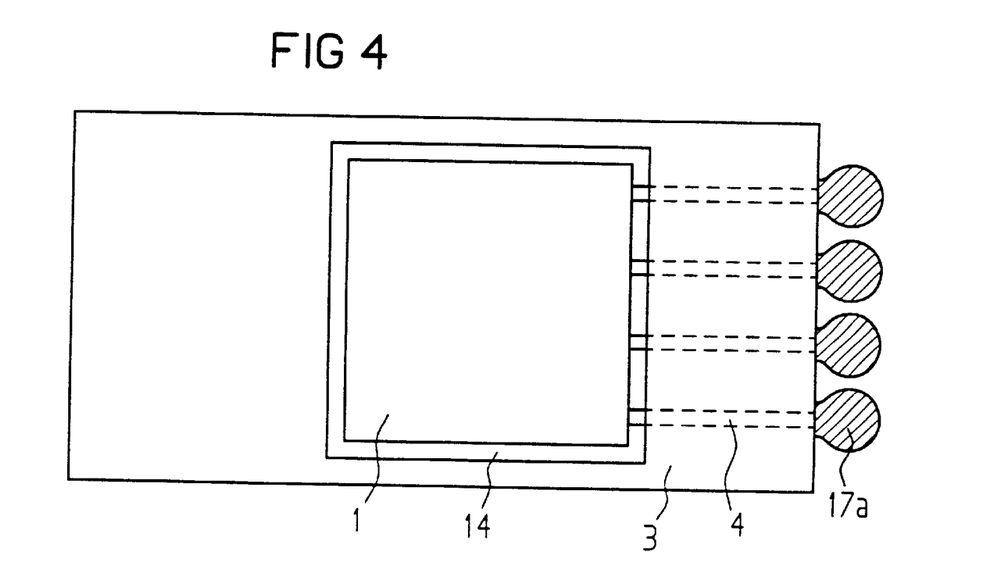
FIG. 4 is a top plan view of the semiconductor component according to the invention shown in FIG. 3.

FIG. 4 shows a top view of a two-layer support material according to FIG. 3. FIG. 4 shows an opening 14 in which precisely one semiconductor chip 1 is inserted. The semiconductor chip 1 is mounted on the substrate layer 2 by means of flip chip contacting (not visible in the figure). From the semiconductor chip 1, the conductor tracks 4 point in one direction of the semiconductor component. The substrate layer 3 which includes the opening 14 is shown transparent for better clarity. The conductor tracks 4 are connected to the balls 17a which allow electrical contacting with a chassis. The conductor tracks 4 on the substrate layer 2 are designed in such a manner that the signal delay from the contact pads 7 to the component contacts 17 is equally large. The demand for a signal delay of equal length between the contact pads 7 and the component contacts 17 ideally necessitates that the contact pads 7 are arranged in one row where the row must be aligned in parallel with the side which contains the component contacts 17. If it is not possible to arrange the component contacts 17 in one row on a semiconductor chip, it is conceivable to tune the individual conductor tracks on the chassis, for example by means of capacitances. However, the most advantageous embodiment can be found by means of the arrangement of the conductor tracks 4 and the contact pads 7 in the semiconductor component.

Figure 5:
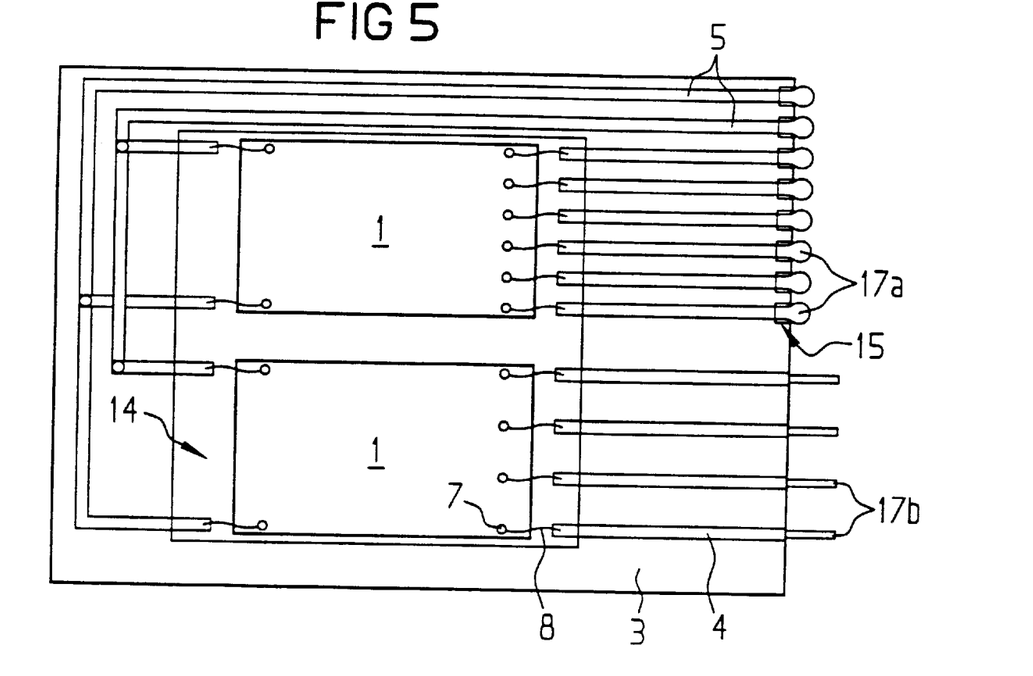
FIG. 5 is a top view of a semiconductor component according to the invention, where two semiconductor chips are accommodated in one opening.

FIG. 5 shows a top view of another two-layer support material. In this illustrative embodiment, two semiconductor chips 1 are arranged in one opening 14. The semiconductor chips 1 are placed face up on a substrate layer 2, for example by means of bonding. For the sake of clarity, a substrate layer 3 which includes the opening 14 is again shown transparent. Conductor tracks 4 which connect the semiconductor chips 1 to component contacts 17 point toward one side of the two-layer support material. The conductor tracks 4 are arranged in parallel so that, in combination with the bonding wires 8, they ensure the same signal delay between the contact pads 7 and the component contacts 17. In the present example, the component contacts 17 are represented by balls 17a in the case of the upper semiconductor chip 1 and by pins 17b in the case of the lower semiconductor chip 1. The balls 17a are inserted into recesses 15 and connected to the conductor tracks 4 and in each case one support conductor track 11. The present two-layer support material includes a particularly advantageous design. A supply line 5 supplies both semiconductor chips 1 at the same time in this case. The supply line 5 is arranged on the side of the semiconductor chip 1 opposite to the signal-conducting contact pads 7. Supplying both semiconductor chips 1 via a common supply line 5 has the advantage that component contacts 17 are saved. In the present example, it was possible to reduce the number of component contacts 17 by two.

Figure 6:
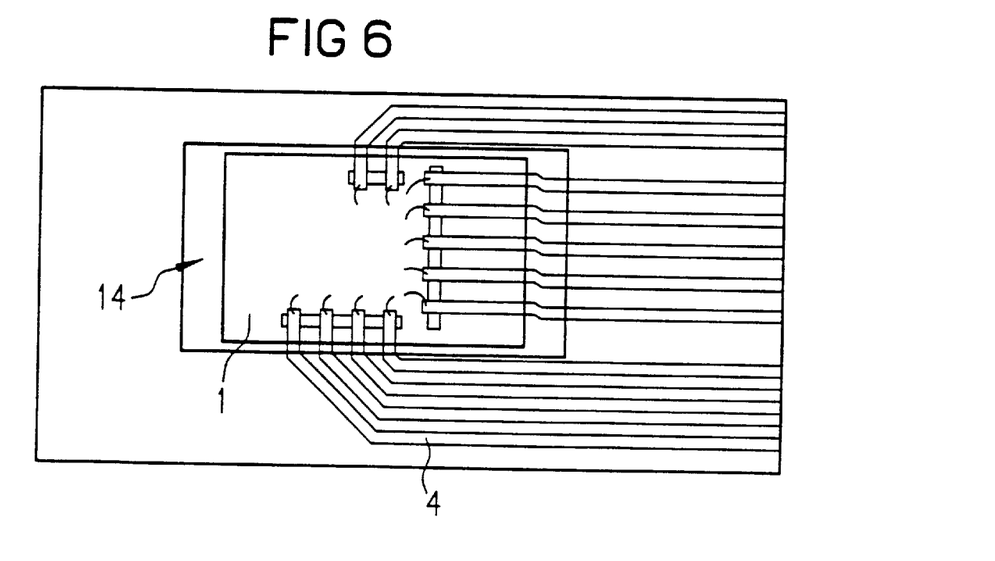
FIG. 6 is a top view of a semiconductor component according to the invention with a possible connection design of the conductor tracks on the semiconductor chip.

FIG. 6 shows the top view of a two-layer support material which consists of two substrate layers 2 and 3, substrate layer 2 being provided with conductor tracks 4 and substrate layer 3 including an opening 14. In the opening 14, a semiconductor chip 1 is located which is placed face up on substrate layer 2. The contact pads 7 of the semiconductor chip 1 are located along the periphery of the semiconductor chip 1 in this case. However, the arrangement of the contact pads on the semiconductor chip 1 can be arbitrary. The substrate layer 2 has been shown transparent for the sake of clarity.

Figure 7:
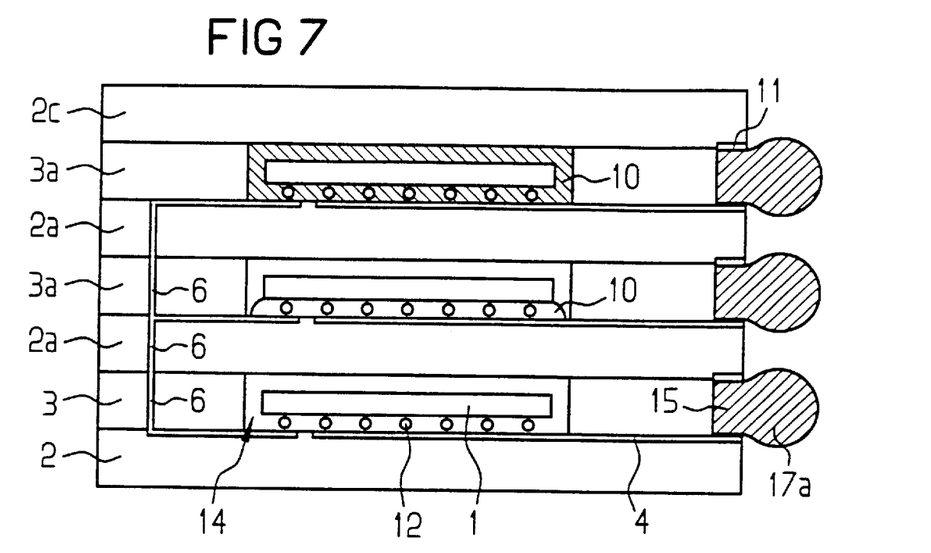
FIG. 7 is a sectional side view of a semiconductor component according to the invention with via holes.

FIG. 7 shows a semiconductor component according to the invention in cross section. The semiconductor component consists of three two-layer support materials, substrate layers 2, 2a being provided with conductor tracks 4 and substrate layers 3, 3a being provided with one opening 14 in each case. The openings 14 of the respective substrate layers 3, 3a are arranged precisely above one another. Similarly, semiconductor chips 1 which are located in the opening 14 of the respective substrate layer 3, 3a and are joined to the respective substrate layer 2, 2a, for example by means of bonding, are located precisely above one another. Substrate layers 3, 3a also include recesses 15. The corresponding substrate layers 2a, 2c are provided with support conductor tracks 11 at the locations of the recesses. Component contacts 17 are constructed as balls 17a and permanently connected to one another by means of conductor tracks 4 and support conductor tracks 11 in the recesses 15 so that a reliable electrical signal can be conducted. The three semiconductor chips 1 are connected mechanically to the substrate layers 2, 2a by means of flip chip contacting 12 and electrically to conductor tracks 4. The substrate layers 3, 2a, 3a also include via holes 6 which, for example, can handle the connection of the semiconductor chips 1 located in different substrate layers 3, 3a. However, it is also conceivable that the via holes 6 are provided for supplying the respective semiconductor chips 1 by means of a single supply line 5 (not shown). The advantage of a single supply conductor track 5 for supplying all semiconductor chips 1 located in the semiconductor component consists in that fewer component contacts 17 must be provided on the outside of the semiconductor component. The semiconductor component, in turn, is closed off by a substrate layer 2c which has neither conductor tracks 4 nor openings 14 nor recesses 15. The semiconductor chips 1 located in the openings 14 can be surrounded by molding compound 10 or not.

Figure 8:
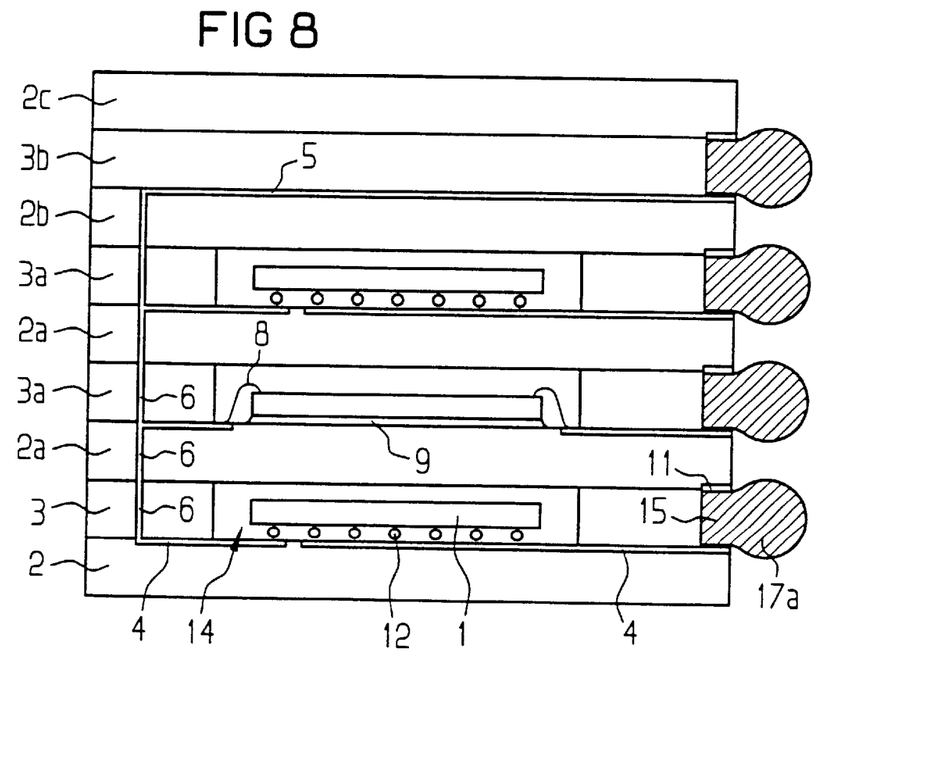
FIG. 8 is a similar side view of a semiconductor component according to the invention, with a common supply line for all semiconductor chips.

FIG. 8 shows a further embodiment of a semiconductor component according to the invention which consists of three two-layer support materials, substrate layers 2, 2a being provided with conductor tracks 4 and substrate layers 3, 3a with in each case one opening 14. The semiconductor component is sealed by a substrate layer 2c which has neither conductor tracks 4 nor opening 14 nor recesses 15. Furthermore, the semiconductor component includes two substrate layers 2b, 3b, substrate layer 2b being provided with conductor tracks while substrate layer 3b only includes the recesses 15. In this example, substrate layers 2b, 3b are exclusively used for the purpose of conducting the supply line 5 into the semiconductor component in a separate plane. The semiconductor chips 1 in the respective substrate layers 3, 3a are supplied via via holes 6 in substrate layers 3, 2a, 3a, 2b. The supply line 5 is brought in on the side to the semiconductor chip 1 which faces away from the side of the semiconductor component which includes the component contacts 17. However, the supply line 5 can be brought to the semiconductor chips 1 at any other location of the semiconductor chip 1.

In the illustrative embodiment shown in FIG. 8, the semiconductor chips 1 are connected to the conductor tracks 4 by means of flip chip contacting 12 or by means of bonding wires 8. It is conceivable that each semiconductor chip 1 is connected electrically to the conductor tracks 4 in a different way. The semiconductor component includes a plane surface on the sides opposite to the component contacts 17. However, it is advantageous if individual substrate layers are elongated beyond the optimized area in order to handle heat distribution. In a particularly advantageous embodiment of the semiconductor component, the substrate layer material consists of an aluminum foil which is partially oxidized through. The aluminum foil partially oxidized through includes, on the one hand, coefficients of thermal expansion which are a better match for the semiconductor chips 1 and, on the other hand, better heat transport compared with a conventional substrate layer material of FR4 is ensured. If the aluminum foil is oxidized through only partially, a core of aluminum remains within the foil. This has the advantage that there is electrical shielding between the individual substrate layers. Mutual interference between the operating characteristics of the semiconductor chips arranged above one another in the respective substrate layers is therefore impossible.

Furthermore, the aluminum foil provides the advantage that better machinability is ensured in punching or stamping the openings 14 or recesses 15, compared with FR4. In the present example, the via holes 6 are constructed to be above one another. However, it is conceivable at any time that the via holes 6 are made at any locations within the respective substrate layers 3, 2a, 3a, 2b. In this case, the electrical interconnection must be ensured by the conductor tracks 4 in the respective substrate layers 2, 2a. In the present illustrative embodiment, the component contacts 17 are constructed as balls 17a which are inserted in the recesses 15 which include support conductor tracks 11. The semiconductor chips 1 located in the openings 14 can be surrounded by plastic molding compound or not, depending on application. In the present embodiment, the openings 14 are not filled with plastic molding compound.

Figure 9:
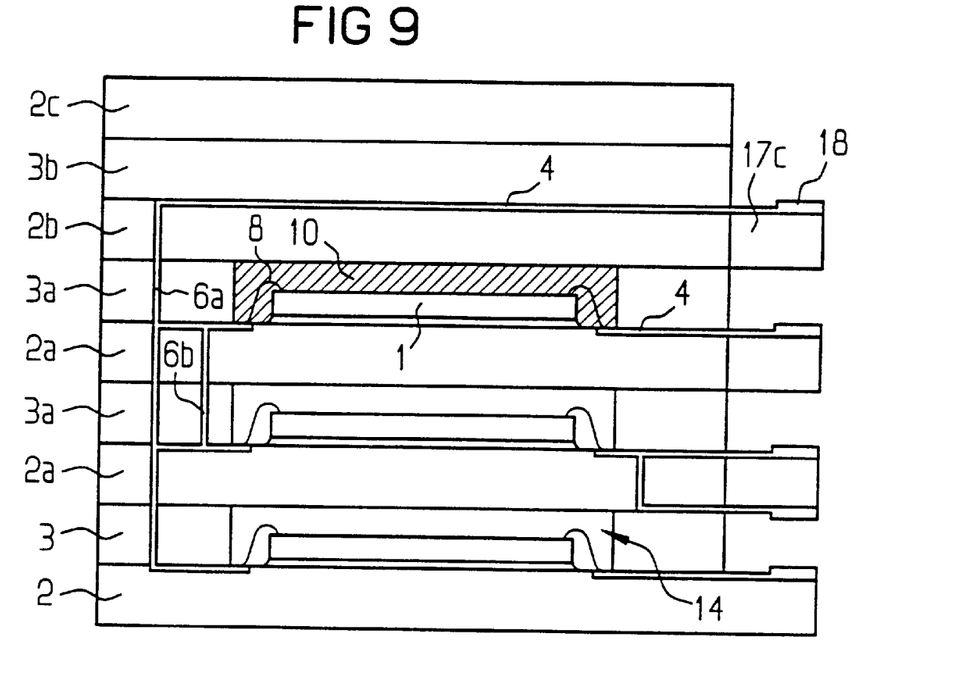
FIG. 9 is a similar side view of a semiconductor component according to the invention, with a common supply line and with mutually connected semiconductor chips and component contacts constructed as plug connections.

FIG. 9 shows a further illustrative embodiment of the semiconductor component according to the invention which, in principle, corresponds to the structure of the semiconductor component from FIG. 8. Apart from substrate layers 2, 3, 2a, 3a, which form the two-layer support materials, two substrate layers 2b, 3b are provided which are used for conducting a common supply line 5 for all semiconductor chips 1 which are located in the respective substrate layers 3, 3a. The supply to the semiconductor chips 1 in the respective substrate layers 3, 3a is ensured by via holes 6 which are provided in the substrate layers 3, 2a, 3a, 2b. Furthermore, the semiconductor component includes via holes 6b which interconnect the semiconductor chips 1 located in the different substrate layers 3, 3a. In an advantageous embodiment of the semiconductor component, in each case one semiconductor chip 1 is located in substrate layers 3, 3a. However, it is also conceivable that a number of semiconductor chips 1, which can be arbitrarily interconnected, are located in one or more openings 14 in the substrate layers 3, 3a. This can be done by means of conductor tracks 4 in the same substrate plane 3, 3a or by means of via holes 6b if the semiconductor chips 1 to be connected are located in different substrate layers 3, 3a.

FIG. 9 shows a special embodiment of the component contacts 17. Whereas the embodiment of the component contacts 17 as balls 17a can only be considered for a permanent connection to a chassis (not shown), the embodiment of the component contacts 17 as plug connections 17c provides the possibility of using them as flexible data carriers. If the semiconductor chips 1 are constructed as non-volatile ferro-DRAMs, the semiconductor component according to the invention can be used as a transportable storage medium. The plug connections 17c shown in FIG. 9 include on their ends metalization contacts 18 which are placed on conductor tracks 4. All plug connections 17c are placed on one side of the semiconductor component. In a conventional embodiment, the plug connections 17c have metalization contacts 18 on only one side. However, a variant is also provided which provides metalization contacts 18 on both sides of the ends of the plug connections 17c. In this case, a signal can be carried to the outside on both sides of substrate layer 2a. It is also conceivable to interconnect the metalization contacts 18 placed on both sides in order to ensure reliable signal conduction of the plug connection 17c to the chassis. Similarly, it is conceivable that there is a combination of metalization contacts 18 placed on one side and metalization contacts 18 placed on two sides on one and the same semiconductor component. In the illustrated example, the semiconductor chips 1 are placed face up on the respective substrate layers 2, 2a, for example by means of adhesive 9. The electrical contacting between contact pads 7 on conductor tracks 4 is made by means of bonding wires 8. In an advantageous embodiment, precisely one semiconductor chip 1 is located on each substrate layer 3, 3a and these are arranged precisely above one another. If, furthermore, attention is paid to equal signal delay between the contact pads 7 and the component contacts 17, in this case the metalization contacts 18, the semiconductor component is especially suitable for radio-frequency applications. If the semiconductor component according to the invention is connected to the chassis, the semiconductor chips 1 are arranged in a perpendicular position with respect to the chassis.

Figure 10:
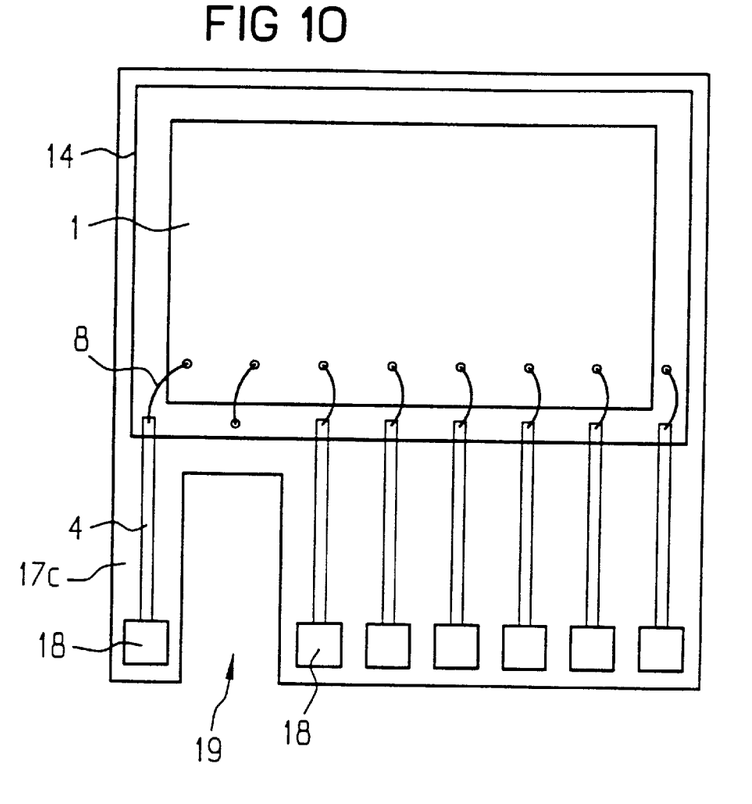
FIG. 10 is a top plan view of a two-layer support material with plug connections as component contacts and coding.

FIG. 10 shows a two-layer support material in a top view, component contacts 17 being constructed as plug connections 17c. In an opening 14 located in a substrate layer 3 a semiconductor chip 1 is inserted face up into this opening 14 and permanently connected to a substrate layer 2, for example by bonding. The semiconductor chip 1 is electrically contacted by means of bonding wires 8 from the contact pads 7 to the conductor tracks 4 which are located on the substrate layer 2. In order to avoid confusion when plugging the semiconductor component into the chassis, and thus to prevent any malfunctions, the substrate layer 2 which includes the conductor tracks 4 includes mechanical coding 19 which is constructed in the form of a recess. In this arrangement, the coding 19 can be arranged at any location on the plug connection 17c. The depth and width of the recess of the mechanical coding 19 can also be defined arbitrarily as long as it is ensured that incorrect plugging into the chassis is prevented.

The plug connections 17c of the semiconductor component are created by an extension of the substrate layers 2, 2a, 2b on the side of the semiconductor component on which the component contacts 17 are arranged. However, the plug connections 17c can also be created by the substrate layers 3, 3a, 3b. Similarly it is conceivable that two interconnected substrate layers 2, 3 or 3, 2a form a plug connection, the mechanical stability being greater in this case.

Figure 11:
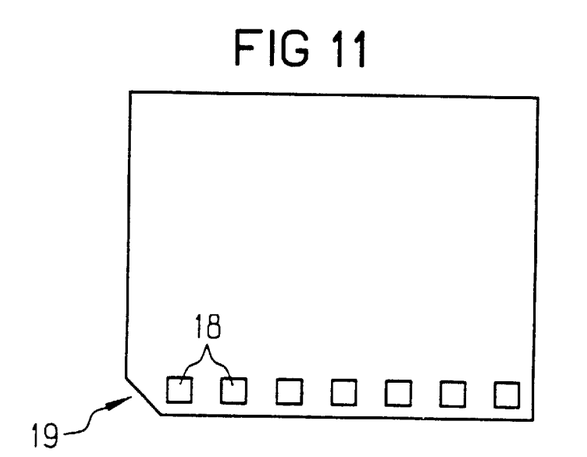
FIG. 11 is a top view of another illustrative embodiment of coding when the component contacts are constructed as plug connections.

FIG. 11 shows mechanical coding 19 of a substrate layer 2, 2a, 3a, an oblique edge being created in one corner area. The mechanical coding 19 can be done by an arbitrary recess on the plug connection 17c. The recess can be a corner which is obliquely cut off or a polygonal cutout.

Figure 12:
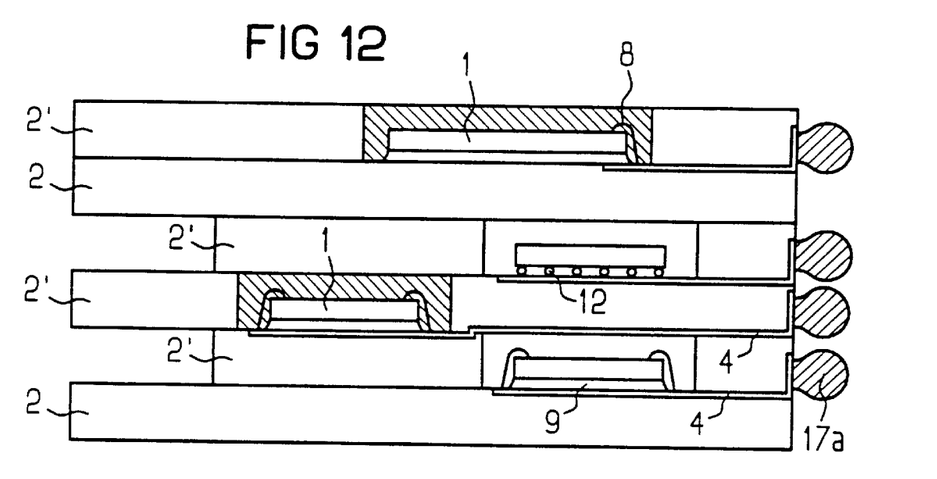
FIG. 12 is a sectional side view of a further exemplary embodiment of the semiconductor component according to the invention.

FIG. 12 shows another variant of a semiconductor component according to the invention in section. The semiconductor component is constructed of a number of substrate layers 2, 2', where each substrate layer 2' can include either conductor tracks 4 or openings 14 or conductor tracks 4 and openings 14. Furthermore, each substrate layer 2' can include at least one semiconductor chip 1 in an opening 14. The semiconductor chips 1 are arranged offset above one another and connected to the substrate layer 2, 2' located underneath. The conductor tracks 4 are conducted to the outside on one side of the semiconductor component where they can be connected to a non-illustrated chassis, for example via balls 17a, via pins 17b or via plug connections 17c. If the substrate layers are elongated beyond a base area, for example alternately on one or more sides, these elongated substrate layers 2, 2' can be used as heat distributors. The base area is the area which can be designed to be the smallest due to the arrangement of the semiconductor chips 1 of all substrate layers. The semiconductor chips 1 can be contacted via flip chip contacting 12, via bonding wires 8 or via a spider tape 13. The openings 14 in which the semiconductor chips 1 are located can be injected with plastic molding compound 10, or not. Furthermore, all semiconductor chips 1 located in the semiconductor component can be supplied via a common supply line 5 (not shown) in order to keep down the number of component contacts. The individual substrate layers 2, 2' are interconnected by bonding, laminating or alloying. It is not necessary that the substrate layers 2, 2' used as heat distributors are arranged alternatingly with a substrate layer 2, 2' taking up a base area. Instead, any combination of base area substrate and enlarged substrate area is conceivable if adequate heat removal is ensured. The advantage in the arrangement of substrate layers which each include an opening for accommodating a semiconductor chip consists in that a lower overall height can be achieved. The semiconductor component can also contain substrate layers (not shown) which contain neither openings nor conductor tracks or recesses because these will then handle, for example, exclusively a heat distributor function.

We claim:

1. A vertically mountable and stacked semiconductor component, comprising:

a plurality of interconnected substrate layers lying above one another and having ends;

at least one semiconductor chip formed with contact pads disposed in an opening formed in said substrate layers;

external component contacts disposed laterally at said ends of respective substrate layers;

an electrical connection between said contact pads of said semiconductor chip and said component contacts, said electrical connection including conductor tracks of a respective substrate layer extending from an area at said semiconductor chip to said edge area of said respective substrate layer, said conductor tracks of a substrate layer having a substantially equal length; and said electrical connection being configured to define a signal delay of substantially equal length between each contact pad of said semiconductor chip to an associated said component contact.

2. The semiconductor component according to claim 1, wherein said substrate layers include substrate layers with said conductor tracks and substrate layers formed with said opening arranged alternately above one another.

3. The semiconductor component according to claim 1, wherein an end of said conductor track in a vicinity of said semiconductor chip is located within a respective said opening.

4. The semiconductor component according to claim 1, wherein said substrate layers are interconnected by anisotropic conductive adhesive.

5. The semiconductor component according to claim 1, which further comprises at least one cover layer neither carrying a conductor track nor having a respective said opening formed therein.

6. The semiconductor component according to claim 1, wherein at least one of said substrate layers extends over other substrate layers on at least one side on which no component contacts are arranged.

7. The semiconductor component according to claim 1, wherein a respective said substrate layer having a semiconductor chip is provided with said conductor tracks on one side thereof.

8. The semiconductor component according to claim 1, wherein a respective said substrate layer having a semiconductor chip is provided with said conductor tracks on two sides thereof.

9. The semiconductor component according to claim 1, wherein said at least one semiconductor chip is one of a plurality of semiconductor chips each supplied via its own supply line f(5).

10. The semiconductor component according to claim 1, wherein said at least one semiconductor chip is one of a plurality of semiconductor chips supplied via a common supply line and said substrate layers having via holes formed therein connected to conductor tracks in at least one of said substrate layers.

11. The semiconductor component according to claim 1, wherein said semiconductor chip is bonded to a respective said substrate layer with anisotropic conductive adhesive.

12. The semiconductor component according to claim 1, wherein said substrate layers are formed of a substrate layer material selected from the group consisting of FR4 and an at least partially through-oxidized aluminum foil.

13. The semiconductor component according to claim 1, wherein said conductor tracks are etched onto said substrate layers.

14. The semiconductor component according to claim 1, wherein said conductor tracks are laminated onto said substrate layers.

15. The semiconductor component according to claim 1, wherein said component contacts are contacts selected from the group consisting of balls, pins, and plug connections.

16. The semiconductor component according to claim 1, wherein at least one of said substrate layers is formed with at least one recess on a side of said component contacts, said at least one recess having a width substantially equal to a width of one said conductor track, and wherein each said conductor track ends in an edge area within a respective said recess.

17. The semiconductor component according to claim 1, which comprises a supporting conductor track disposed below a respective said substrate layer provided with said conductor tracks, said supporting conductor track being disposed at said opening of a respectively lower-lying substrate layer and having a size corresponding to said opening.

18. The semiconductor component according to claim 1, which further comprises at least one cover layer neither carrying a conductor track nor having a respective said opening formed therein, and a supporting conductor track disposed below a respective said substrate layer provided with said conductor tracks, and said cover layer, said supporting conductor track being disposed at said opening of a respectively lower-lying substrate layer and having a size corresponding to said opening.

19. The semiconductor component according to claim 16, which comprises ball contact attached in said at least one recess.

20. The semiconductor component according to claim 1, wherein said conductor tracks of at least one said substrate layer project beyond said substrate layer by no more than a thickness of two substrate layers lying above one another.

21. The semiconductor component according to claim 1, which comprises a plug connection formed by an elongated substrate layer on a side of said component contacts.

22. The semiconductor component according to claim 21, wherein said plug connection includes a metalization contact for carrying an electrical signal.

23. The semiconductor component according to claim 21, wherein said plug connection includes two metalization contacts each for carrying a same electrical signal.

24. The semiconductor component according to claim 21, wherein said plug connection is a mechanically coded plug connection.

* * * * *